United States Patent
Busnaina et al.

(10) Patent No.: US 8,937,293 B2
(45) Date of Patent: Jan. 20, 2015

(54) NANOSCALE INTERCONNECTS FABRICATED BY ELECTRICAL FIELD DIRECTED ASSEMBLY OF NANOELEMENTS

(75) Inventors: Ahmed Busnaina, Ashland, MA (US); Cihan Yilmaz, Boston, MA (US); TaeHoon Kim, Revere, MA (US); Sivasubramanian Somu, Boston, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 13/499,809

(22) PCT Filed: Oct. 1, 2010

(86) PCT No.: PCT/US2010/051129
§ 371 (c)(1),
(2), (4) Date: Apr. 2, 2012

(87) PCT Pub. No.: WO2011/041682
PCT Pub. Date: Apr. 7, 2011

(65) Prior Publication Data
US 2012/0326310 A1     Dec. 27, 2012

Related U.S. Application Data

(60) Provisional application No. 61/247,706, filed on Oct. 1, 2009, provisional application No. 61/248,929, filed on Oct. 6, 2009.

(51) Int. Cl.
*H01L 29/66*      (2006.01)
*H01L 21/3205*      (2006.01)
(Continued)

(52) U.S. Cl.
CPC ...... *H01L 21/2885* (2013.01); *H01L 21/76879* (2013.01); *H01L 23/53242* (2013.01);
(Continued)

(58) Field of Classification Search
CPC .................. H01L 21/2885; H01L 23/53242; H01L 23/53276; H01L 21/76879; H01L 2221/1094; H01L 51/00; B82Y 10/00; B82Y 30/00; B82Y 40/00; B81C 1/00206; B82B 3/00; C01B 31/0253; C01B 2202/36; C01B 2202/34; B81B 2201/0214
USPC ........ 257/9, E29.166, E21.294, 50, 665, 529, 257/530, 1–5; 438/597, 466, 785
See application file for complete search history.

(56) References Cited

U.S. PATENT DOCUMENTS

2004/0147062 A1    7/2004   Sinha
2007/0105377 A1    5/2007   Koos et al.
(Continued)

*Primary Examiner* — David Vu
*Assistant Examiner* — Mouloucoulaye Inoussa
(74) *Attorney, Agent, or Firm* — McLane, Graf, Raulerson & Middleton, PA

(57) ABSTRACT

The invention provides a fast, scalable, room temperature process for fabricating metallic nanorods from nanoparticles or fabricating metallic or semiconducting nanorods from carbon nanotubes suspended in an aqueous solution. The assembled nanorods are suitable for use as nanoscale interconnects in CMOS-based devices and sensors. Metallic nanoparticles or carbon nanotubes are assembled into lithographically patterned vias by applying an external electric field. Since the dimensions of nanorods are controlled by the dimensions of vias, the nanorod dimensions can be scaled down to the low nanometer range. The aqueous assembly process is environmentally friendly and can be used to make nanorods using different types of metallic particles as well as semiconducting and metallic nanaotubes.

26 Claims, 12 Drawing Sheets

(51) Int. Cl.
  *H01L 21/288* (2006.01)
  *H01L 21/768* (2006.01)
  *H01L 23/532* (2006.01)
  *B82Y 10/00* (2011.01)
  *B82Y 30/00* (2011.01)

(52) U.S. Cl.
  CPC ........... *H01L23/53276* (2013.01); *B82Y 10/00* (2013.01); *B82Y 30/00* (2013.01); *H01L 2221/1094* (2013.01); *H01L 2924/0002* (2013.01)

USPC .............................................. 257/9; 438/597

(56) References Cited

U.S. PATENT DOCUMENTS

| | | |
|---|---|---|
| 2007/0122932 A1 | 5/2007 | Kodas et al. |
| 2007/0200477 A1 | 8/2007 | Tuominen et al. |
| 2009/0087622 A1* | 4/2009 | Busnaina et al. ............. 428/173 |
| 2011/0023955 A1* | 2/2011 | Fonash et al. ................. 136/256 |
| 2011/0024719 A1* | 2/2011 | Sridhar et al. ................... 257/9 |

* cited by examiner

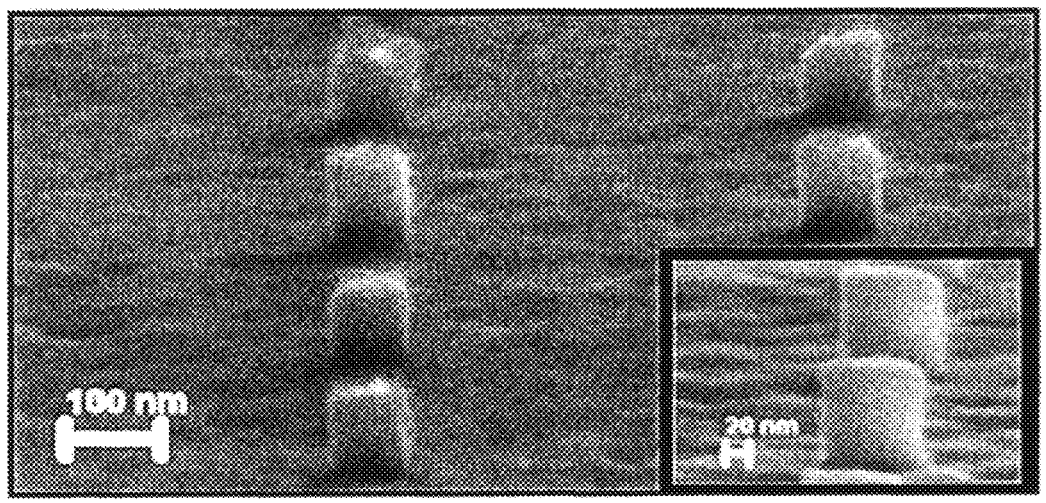
*FIG. 6A*          *FIG. 6B*

NANOSCALE INTERCONNECTS FABRICATED BY ELECTRICAL FIELD DIRECTED ASSEMBLY OF NANOELEMENTS

CROSS-REFERENCE TO RELATED APPLICATIONS

This application is a national stage application under 35 U.S.C. §371 of international application PCT/US2010/051129, filed Oct. 1, 2010, and claims priority to U.S. Provisional Application Ser. No. 61/247,706, entitled "Nanoparticle Interconnects by Directed Assembly", filed on Oct. 1, 2009, and to U.S. Provisional Application Ser. No. 61/248,929, entitled "Single Wall Carbon Nanotube Interconnects by Directed Assembly", filed on Oct. 6, 2009. Both of said provisional applications are hereby incorporated by reference in their entireties.

STATEMENT REGARDING FEDERALLY SPONSORED RESEARCH OR DEVELOPMENT

The invention was developed with financial support by Grant No. 0425826 from the National Science Foundation. The U.S. Government has certain rights in the invention.

BACKGROUND

The precise assembly of nanoscale materials in a desired location and orientation on surfaces makes possible the fabrication of various types of novel structures and devices [1]-[3]. Nanoparticles are model nanoscale building blocks due to their zero-dimensional geometry and unique size-dependent properties [4]. For example, functionalized gold nanoparticles can be used to fabricate sensitive biosensors [5], closely packed metallic nanoparticle arrays show significant electromagnetic field enhancement [6], and silica nanoparticles in predefined arrays enable novel optical devices [7]. Bottom-up nanoparticle-directed assembly processes can be used to fabricate these nanoscale structures. For example, 1-D organization of individual metallic nanoparticles has been used to fabricate 1-D metal nanowires [8]. These structures not only show unique electrical and optical properties [9], [10], but they also provide solutions for the technological and fundamental challenges faced by the conventional top-down fabrication processes in the sub-100 nm regime [11].

Although, many techniques have been developed to integrate nanoparticles directly onto surfaces for various applications [12]-[15], dielectrophoresis (DEP) [16] has been used to manipulate nanoparticles onto electronic devices. Nanoscale interconnects have been fabricated using the advantage of interparticle chain formation, [8]. Electrical characterization of produced in-plane (2-D) [17] and intraplane (3-D) [18] interconnects has been achieved. In these assembly processes, the two electrodes required for applying the electric field are usually on the same substrate or very close to each other (order of microns), making the fabrication techniques unsuitable for specific applications such as interconnects in CMOS-based devices [19] and various types of electromagnetic-field-enhancement sensors. A recent study demonstrates the fabrication of gold nanorods in a porous alumina template using an AC electric field between two electrodes placed 1 µm away from each other [20]. However, the process provided no control over the length of the nanorods, impeding the potential use of the rods in sensors and CMOS interconnect applications.

Carbon nanotubes are considered as a potential candidate material for interconnect applications in gigascale systems [21-24] due to their resistance to electromigration and larger mean free path compared to that of metals. For vertical and lateral interconnects researchers have used high temperature chemical vapor deposition methods to grow carbon nanotubes on pre-patterned substrates. However, these high temperature processes are not compatible with CMOS technology [14, 15]. For lateral interconnects researchers have used post-growth assembly techniques such as dielectrophoresis in which only an AC field or an electrical field gradient is used. For local vertical interconnects, the methods that have been carried out are not highly scalable.

Thus, there remains a need to develop methods for the rapid, scalable fabrication of conductive nanorods to serve as interconnects in nanoscale circuitry and devices. The new methods should avoid harsh chemical and physical conditions and should be consistent with CMOS fabrication techniques.

SUMMARY OF THE INVENTION

The invention provides methods for fabricating electrically conductive nanorods or interconnects using electric-field-directed assembly of nanoparticles or nanotubes and interconnects made by the methods. An externally applied dynamic electric field (AC) with a DC offset allows nanoparticles such as colloidal gold to uniformly assemble and fuse in prepatterned surfaces (vias). The electric field is applied between a prepatterned surface containing vias and a counter electrode placed 5 mm away from the vias. Control over the directed-assembly process is provided by manipulation of different forces acting on the nanoparticles or nanotubes imposed by AC and DC electric fields. The assembly process is carried out in aqueous solution having a pH greater than 7, e.g., with a low concentration of ammonium hydroxide and hence is environmentally green. The fabricated nanorods can be used for various nanoscale applications including electronic, photonic, and biomedical devices.

One aspect of the invention is a method of fabricating a nanoscale interconnect by electrical field directed assembly of nanoelements. The method includes the steps of providing a nanosubstrate containing vias, contacting the nanosubstrate with an aqueous suspension of nanoelements, and applying an electrical field between the nanosubstrate and an electrode in the suspension, whereby nanoelements from the suspension migrate into the via to form the nanoscale interconnect. The nanosubstrate includes a base layer, a conductive layer deposited onto the base layer, and an insulating layer (e.g., a resist layer for lithography) deposited onto the conductive layer. The insulating layer contains one or more vias. Each via forms a void or space in the insulating layer, which defines a pathway through the insulating layer that exposes the conductive layer to the suspension that is contacted with the nanosubstrate so as to cover the vias for assembly. The electrical field is the sum of a constant, uniform DC voltage and a dynamically fluctuating AC voltage. The combination of AC voltage with a DC offset ensures that both dielectrophoretic and electrophoretic forces act on the nanoelements to drive assembly. The nanoelements can be either metallic or semiconducting, and they can be in the form of nanoparticles or nanotubes. In one embodiment the nanoelements are metallic and fuse to form a solid mass of metal during the assembly process.

Another aspect of the invention is a nanoscale interconnect made by the method described above. The interconnect is electrically conducting and generally elongated in shape. The interconnect has nanoscale dimensions, including a diameter or width in the range from about 2 nm to 10 or more microns, a length in the range from about 2 nm to about 10 µm, and an aspect ratio of about 0.1 or greater. In certain embodiments the interconnect comprises fused metallic nanoparticles or a bundle of single-walled carbon nanotubes (SWNT). In certain embodiments, the interconnect has a diameter less than 30 nm and an aspect ratio of 3 or more.

Yet another aspect of the invention is an integrated circuit or sensor that contains a nanoscale interconnect as just described. The interconnect is used to provide electrical continuity between different circuit domains in different layers or different areas of the device.

Other features and advantages of the invention will be apparent from the following description of the preferred embodiments thereof and from the claims, taken in conjunction with the accompanying drawings.

BRIEF DESCRIPTION OF THE DRAWINGS

FIG. 2(a) is a top view. FIG. 2(b) is a high-angle view. The inset (FIG. 2(c)) shows an SEM image of fused 50 nm particles in the vias after the assembly process.

FIG. 6(a) is a high-angle SEM image of fabricated 70 nm nanorods. 12 Vpp was applied to 5-nm gold nanoparticles at a frequency of 10 kHz. The inset (FIG. 6(b)) shows a high magnification SEM of fabricated nanorods indicating particle fusion.

DETAILED DESCRIPTION OF THE INVENTION

Figure 1A:
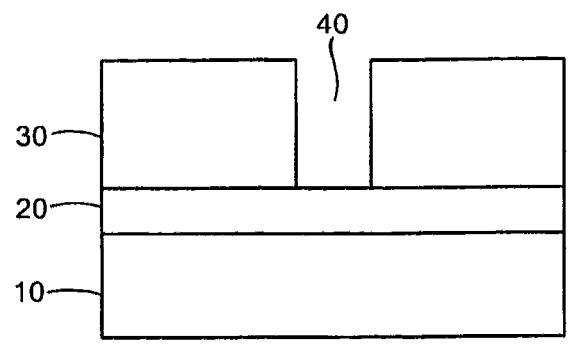
FIG. 1(a) shows a schematic drawing of a nanotemplate with a via.

The inventors have developed new methods for fabricating electrically conductive nanorods to serve as interconnects for nanoscale circuitry and electronic or electromechanical devices. The methods utilize electrophoretic and dielectrophoretic forces to direct the assembly of nanoparticles or nanotubes into appropriately prepared nanosubstrates containing "vias" or spaces in an electrically insulating layer covering a conductive layer on a substrate. An externally applied dynamic electric field (AC) combined with a DC offset allows metallic or semiconducting nanoelements such as colloidal gold nanoparticles or SWNT to uniformly assemble and in a prepatterned surface of a nanosubstrate and to bind or fuse into a continuous mass or bundle.

The method of the present invention is distinguished from former methods for making nanorods in particular by how the electrical field is applied and therefore how the nanoelements are directed and assembled. The electrical field is applied between a prepatterned surface containing vias, which have an electrically conductive layer at their bottom surface and a counter electrode placed some distance away from the vias in a suspension containing the nanoelements for assembly. The conductive layer is exposed at the bottom of the vias. The assembly process is controlled by manipulating the electrophoretic and dielectrophoretic forces acting on the nanoparticles or nanotubes as a result of the AC and DC electrical fields. The assembly process is carried out in aqueous suspension of nanoelements. The aqueous suspension uses purified water (e.g., distilled or deionized water, or water purified by another method) as the medium in which the nanoelements are suspended. The medium should have a low conductivity by the addition of a small amount of one or more electrolytes, such as a salt. The pH value of the medium is not restricted, but in a preferred embodiment the pH is greater than 7. A preferred medium is purified water containing a low concentration (e.g., a μM or low mM range concentration, such as 0.1-1 mM) of ammonium hydroxide. The assembly method according to the invention can be practiced at ambient conditions such as room temperature (e.g., between about 15 and 30° C.) and atmospheric pressure and without the use of harsh or toxic chemicals. Therefore, the methods are environmentally sensitive and represent "green" technology.

As used herein, the term "nanoscale" refers to components having an overall size ranging from about 1 to about 999 nm. While the nanoelements used for assembly have at least one dimension in the nanoscale size domain, it is understood that they may possess one or more size dimensions outside this range. For example, nanotubes have a diameter of a few nm but can be obtained in length of much greater size that could fall outside the nanoscale range; nevertheless, such nanotubes are still "nanoscale" as it applies to the present invention. Further, assembled structures, such as nanorods or bundles of nanotubes, can have a dimension that exceeds the nanoscale range. In certain embodiments, the nanoelements or nanoscale assembled structures of the invention can have a size in the range of 1-10 nm, 1-50 nm, 1-100 nm, less than about 1000 nm, less than about 500 nm, less than about 200 nm, less than about 100 nm, less than about 50 nm, less than about 20 nm, or less than about 10 nm.

A "substrate" as used herein refers to a solid material upon which nanoelements are assembled by a method according to the invention. A substrate is generally flat but can have any dimensions, according to its anticipated use. For example, the substrate can be a structure used in the fabrication of an integrated circuit, sensor, or nanoscale device. The substrate can be of any suitable material, but usually the subtrate contains a material such as silicon, silicon oxide, a polymer, or any structural material used in the fabrication of an integrated circuit, sensor, or nanoscale device. The substrate is a structurally and mechanically stable platform, and it is typically nonconductive, though it may have conductive materials or layers deposited on it or integrated within it.

A "nanoelement" as used herein is any nanoscale physical structure that can be assembled to form an interconnect using a method according to the invention. Examples of such nanoelements include nanotubes, nanoparticles, and nanowires. Preferred nanotubes are carbon nanotubes, which include single-walled carbon nanotubes (SWNT) or multi-walled carbon nanotubes. SWNT have a diameter on the order of nanometers and can be several microns in length. SWNT can behave as metals (metallic SWNT) or semiconductors (semiconducting SWNT) depending on their chirality and physical geometry. SWNT for use in the invention also can be of mixed chirality, i.e., a mixture of both metallic and semiconducting SWNT. The SWNT also can be derivatized or functionalized. Preferred are open-ended SWNT that terminate in carboxyl groups, which bear a net negative charge that can be offset by binding to cations. Suitable nanoparticles are metallic or semiconducting nanoscale particulate structures that can have any suitable geometry, including spherical. Preferred nanoparticles include gold nanoparticles, copper nanoparticles, silver nanoparticles, tungsten nanoparticles, aluminum nanoparticles, and other metallic nanoparticles. The size of the nanoparticles can be any size within the nanoscale range. Preferably, the particles have an average size of about 2-50 nm, although it is understood that the size of the particles may be determined by the size of the vias in which they will be assembled (particles must be smaller than the width of the vias). The width or diameter of the vias is preferably 50 nm or less, but it can be any size greater than 2 nm, ranging up to several microns. In some embodiments, the width or diameter of the vias is greater than about 30 nm, i.e., greater than the maximum size achievable by electroplating. The size of the vias and nanoelements will affect the electrical parameters required for optimal assembly. In addition to theoretical considerations (see below), some experimental optimization may be required when altering the size, shape, or material of the nanoelements as well as the geometry of the vias.

Figure 1B:
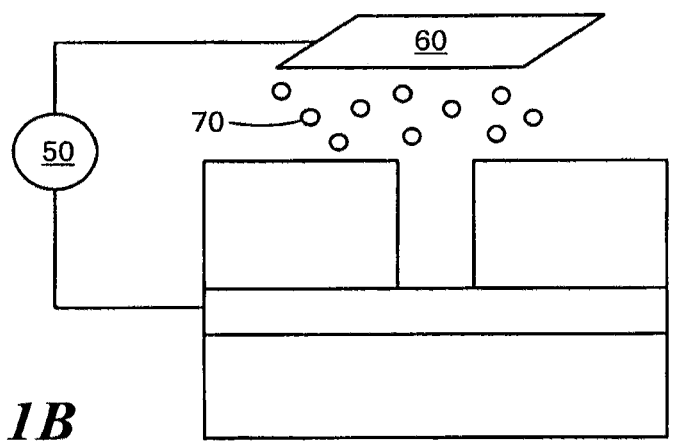
FIGS. 1(b) and 1(c) show a schematic drawing of an electric-field directed assembly process.
Figure 1C:
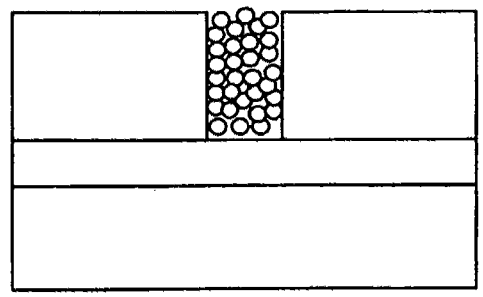

The nanosubstrate used for assembly has the following characteristics. It contains a base layer 10 (FIG. 1) that serves to provide structural support and is preferably made of a rigid non-conductive material. The base layer can be flat, and it can have any desired structures built into it, such as channels, platforms, holes, etc., which can be constructed by known techniques, such as photolithography, electron beam lithography, cutting, polishing, molding, or polymerizing suitable materials. The thickness of the base layer is not critical for most applications, and can range, for example from 100 nm to several cm or more. A wide variety of non-conducting materials can be used for the base layer of a nanosubstrate. Silicon wafers, for example, are capable of being used as a base layer. A preferred material is silicon dioxide ($SiO_2$, also referred to as silicon oxide). Other suitable materials include organic or inorganic insulating materials, e.g., non-conducting oxides.

The nanosubstrate also contains a conductive layer 20 made of an electrically conductive metal that is deposited on a surface of the base layer. The conductive layer can be continuous across the entire surface, or it can be limited to one or more portions of the surface. The conductive layer will be exposed at the bottom of any vias intended for assembly of interconnects. The conductive layer can have any thickness as required for the particular circuit it is a part of, but generally the thickness is in the range of 1 nm to several microns. The conductive layer can be deposited by known techniques, including any method that provides a generally homogeneous, thin layer with good molecular contact and adhesion to adjacent layers. For example, chemical vapor deposition and physical vapor deposition are suitable methods for depositing metals. A preferred method for depositing metals is sputtering. Any conductive metal or alloy can be used to form the conductive layer. Preferred are gold and gold alloys, such as Cr/Au.

An insulating layer 30 is deposited on the surface of the conductive layer. When the conductive layer covers only a portion of the base layer, the insulating layer can be deposited over exposed regions of the base layer as well. The purpose of the insulating layer is to provide a template for the directed assembly of nanorods, such as those that will serve as circuit interconnects. Therefore, the insulating layer is a layer of an electrically insulating material such as a polymer, silicon oxide, or any suitable insulating material. However, it is necessary to fabricate open spaces or vias in the insulating material for the assembly of nanoelement. In some embodiments, the insulating material is a material that can be readily removed, such as by dissolving it with a solvent, after nanoelement assembly is completed. A preferred material is a lithographic positive resist material such as poly-methyl-methacrylate (PMMA), which can be deposited in a liquid state by spin coating. Since the thickness of the insulating layer will determine the length of the final assembled nanorods, the thickness should be chosen accordingly. Generally, the thickness of the insulating layer, and the length of the nanorods, is in the range from about 2 nm to about 10 μm or more. Once the insulating layer material has polymerized, a desired pattern of vias 40 can be fabricated into the insulating layer by a method capable of forming nanoscale features, such as electron beam lithography. To form the vias, the insulating layer material is removed at desired locations, leaving the vias having the desired shape, size, and location. The insulating layer should be removed at the vias sufficiently during lithography that the conductive layer at the bottom of the vias is exposed after lithography and when contacted with the nanoelement suspension for assembly. After the nanorods have been assembled, the insulating layer can be removed if desired in order to expose the nanorods for further processing or fabrication steps. For example, PMMA can be removed by dissolving it with acetone.

In order to assemble nanorods in the vias of the nanosubstrate, the nanosubstrate is contacted with a suspension containing the nanoelements 70 (FIG. 1) for assembly and a suitable electrical field is induced to direct the assembly. A variety of arrangements can be used, but typically the nanosubstrate is immersed in whole or part in the suspension, which is present in an electrically insulating solid container, such as a glass or plastic vessel. Also present in the suspension is an electrode 60 that is connected to one lead of a power supply 50 capable of delivering the sum of AC and DC voltages. The other lead of the power supply is connected to the conducting layer of the nanosubstrate. The electrode is placed in the suspension opposite the surface of the nanosubstrate containing the vias. Preferably, the electrode is planar and parallel to the surface of the nanosubstrate, so that an essentially uniform electrical field is presented across the surface of the nanosubstrate. The electrode contains a suitable electrically conducting material in contact with the suspension. An inert highly conductive metal such as gold or platinum is preferred. The distance separating the electrode and the surface of the nanosubstrate is in the range from about 100 μm to about 10 mm or more, with about 5 mm preferred.

The suspension contains a medium and a plurality of evenly dispersed nanoelements. The medium is preferably water, but it may contain a low concentration of one or more solutes, including salts or buffers. The medium should be consistent with stably maintaining the nanoelements in a dispersed state; aggregation of the nanoelements is to be avoided. Preferably, the water contains a low concentration (e.g., 01-1 mM) of a base such as ammonium hydroxide, in order to raise the pH above 7 and to provide a low level of conductivity to the medium. The precise concentration or pH is not critical. The nanoelements are present in the suspension at a suitable concentration for assembly, such as about $1\times10^4$ to about $1\times10^{20}$ particles per mL. Preferably the concentration of nanoelements is about $1-2\times10^{10}$/mL. High concentrations that promote the aggregation of the nanoelements should be avoided.

Figure 4:
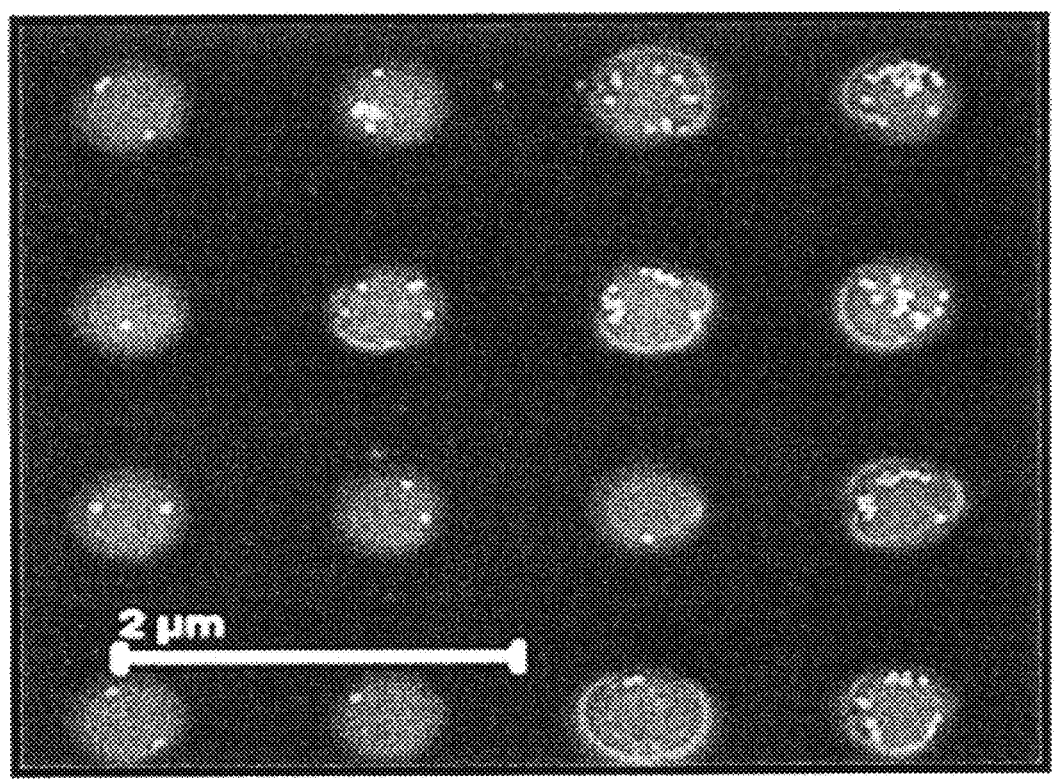
FIG. 4 is an SEM image showing the product resulting from electrophoretic assembly of gold nanoparticles in the vias. The particles were exposed to a DC voltage of 2 V for 90 s.

The assembly process is begun by applying an electrical field between the conductive layer of the nanosubstrate and the suspension electrode. As shown in FIG. 4 and discussed in Example 3 below, the application of a constant uniform DC electrical field promotes the migration of nanoelements toward the nanosubstrate by electrophoresis; however, a constant field alone does not lead to very much assembly of nanoelements within the vias. In order to achieve a high rate of assembly, an AC electrical field must be imposed. However, AC alone also produces suboptimal results, leading to significant assembly in the vias only at the edge of the nanosubstrate (see FIG. 5 and Example 3). Optimal high rate assembly across the entire substrate is observed when the electrical field consists of the sum of an AC field and a DC field, as shown in FIG. 1 and discussed in Example 1.

With the present method, the assembly occurs rapidly, and is generally completed in a matter of seconds to minutes. Preferably the assembly is complete in about 60 seconds or less. An important consideration in achieving rapid kinetics of assembly is the geometry of the nanosubstrate and the suspension electrode. High intensity electric fields, particularly for AC fields which drive assembly and migration of nanoelements into the vias, are obtained near edges and vertices of both the substrate and the counter electrode in suspension. A favorable geometry is the use of planar and rectangular nanosubstrate and electrode. In one embodiment, the counter electrode has substantially the same shape and geometry as the nanosubstrate, For example, the counter electrode can be a metal-plated (e.g., gold plated) structure of similar size and shape as the nanosubstrate.

The data shown in the Examples support a requirement to use an applied electrical field having both AC and DC components in order for field directed assembly and fusion of nanoelements to form a nanoscale interconnect. An AC voltage with a DC offset needs to be applied to achieve uniformly distributed successful nanorod fabrication in the vias. The nanoparticle assembly under the applied AC electric field occurs due to the imbalance of dielectrophoretic forces on the particle [35]. The nanoparticles move toward the via array where the electric field is nonuniform and strong. In addition to this, dielectrophoretic forces are only effective if very close to the substrate surface (close to the vias) [35]. Particle chaining in the vias occurs when a certain threshold particle concentration is reached near the template surface [9]. The experiments presented below show that under the applied AC voltage without a DC offset, particle chaining occurs only in the vias located at the edges of the array, where the electric field is stronger than the center. This indicates that the particle concentration reaches a threshold value for the particle chaining to occur in the vias at the edge of the array only. On the other hand, the DC force arises from charged-particle-electrode electrostatic interactions and is effective on the particles far from the template [35]. Therefore, by using a DC electric field, the particles far from the template can be attracted to the template, thereby increasing the particle concentration near the template surface [34]. The uniformity of the particle assembly over the via array is due to the uniformity of the applied DC electric field (see FIG. 4). Hence, when an AC voltage is applied with a DC offset, the particle chaining occurs not only in the edge vias, but it also forms over the entire via array. The major contribution of AC field arises from the chaining forces induced on the nanoparticles, leading to a nanoparticle chain growth in the vias. The contribution of a DC offset is to increase the particle concentration near the electrode surface, allowing the particle chaining to occur in each via.

The nature of the assembly is also affected by the intensity of the applied AC electric field. Since the dielectrophoretic force on the particles depends on the gradient of the field intensity [3], particle chaining in the vias occurs when the dielectrophoretic attraction force between the particles and the electrode becomes stronger than the electrostatic repulsion of the counterion atmosphere [9]. In the experiments presented below, a significant drop in nanorod formation was observed at lower field intensities ($<12$ $V_{pp}$), whereas very high assembly rate was observed at higher field intensities ($>12$ $V_{pp}$). Dielectrophoretic forces and chaining forces are also affected by the applied frequency [8]. As the frequency is increased, the counterions on the particle cannot follow the rapidly oscillating field and the dipole polarization. Therefore, particle interaction with the applied electric field decreases. The present inventors have observed that at higher frequencies (~100 kHz), there was a significant decrease in the particle assembly rate in the vias, whereas the assembly rate increased at lower frequencies (~1 kHz). In addition to these parameters, electrohydrodynamic flow due to the DC as well as the AC electric field has an effect on the assembly process. A fraction of applied DC and AC potentials can also drop across the Helmholtz double layer at the electrode surface [36].

Figure 2:
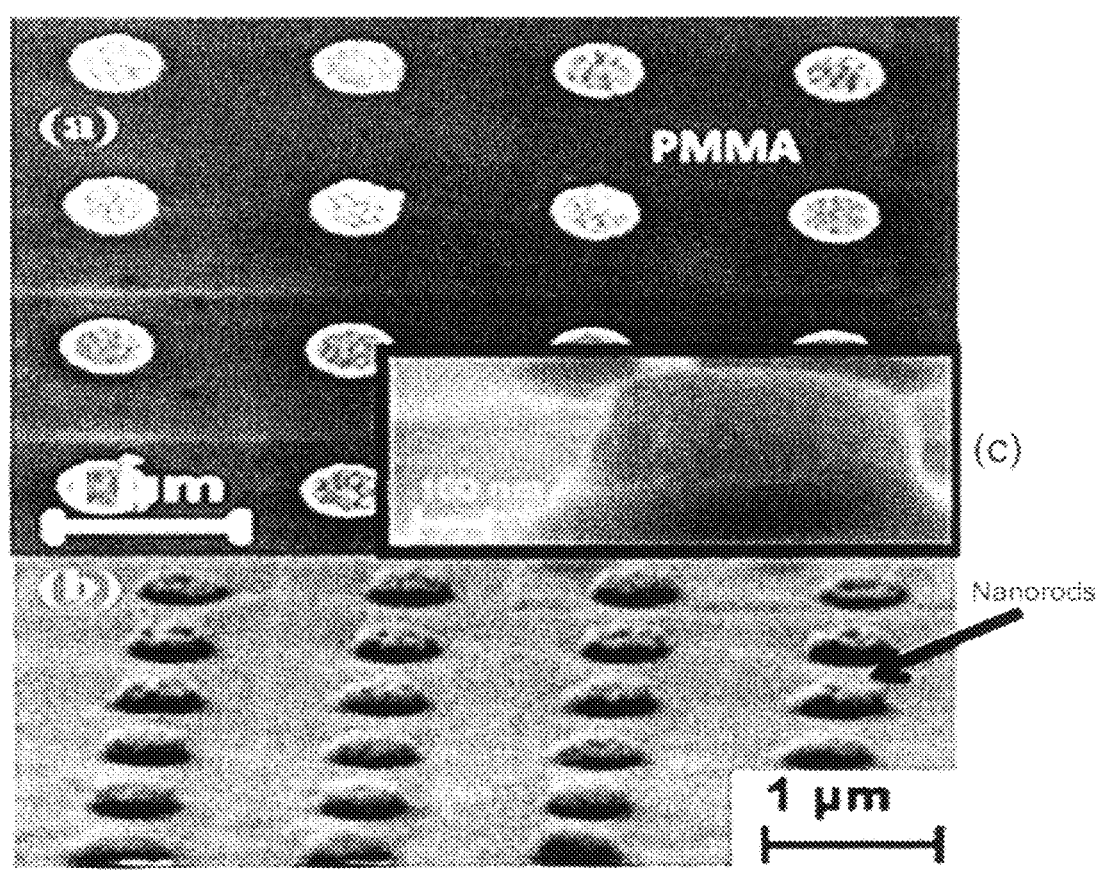
FIG. 2 shows SEM images of gold nanorods fabricated in 500 nm PMMA vias.
Figure 3A:
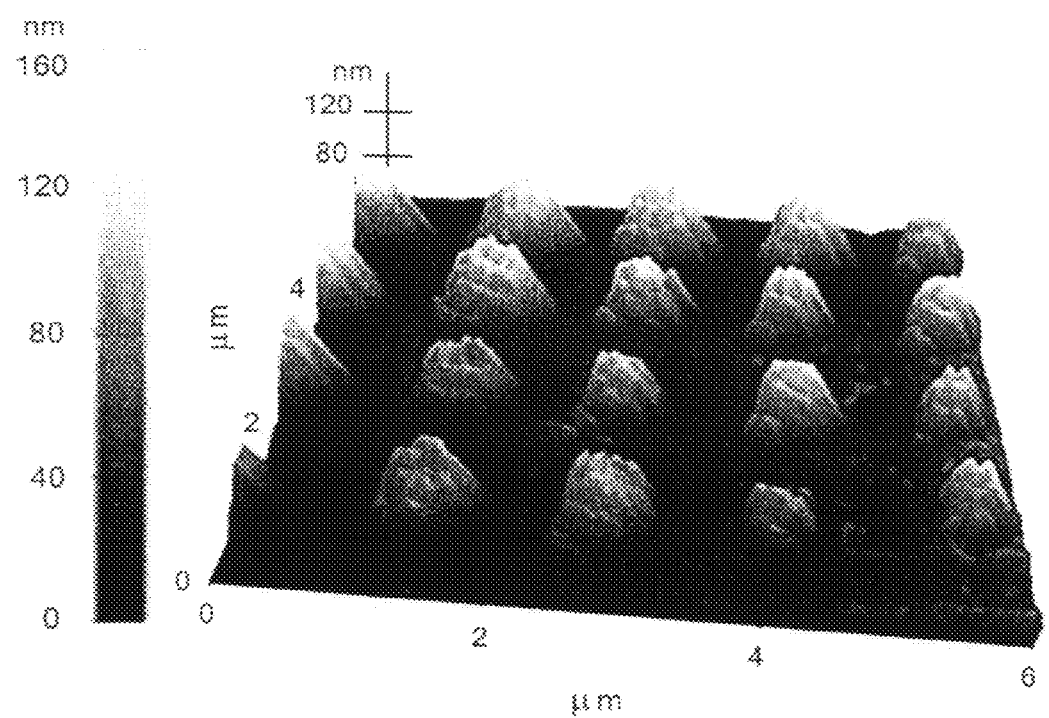
FIGS. 3(a) and 3(b) show AFM images of nanorods according to the invention. The top-right image (FIG. 3(c)) shows an SEM image corresponding to the AFM-scanned area. At lower right are profiles of the surface in FIG. 3(b) at the indicated horizontal line (FIG. 3(d), upper profile) and vertical line (FIG. 3(d), lower profile).
Figure 3B:
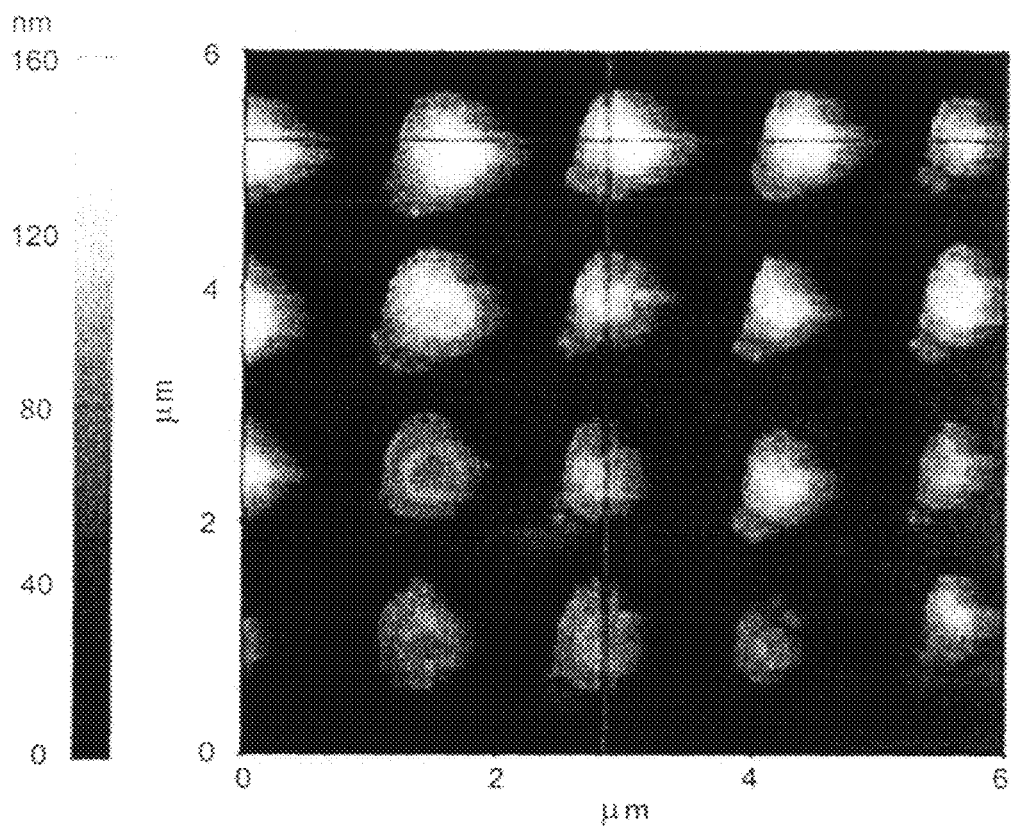
Figure 3C:
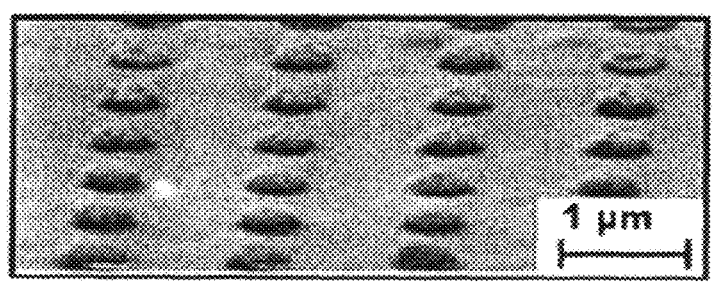
Figure 3D:
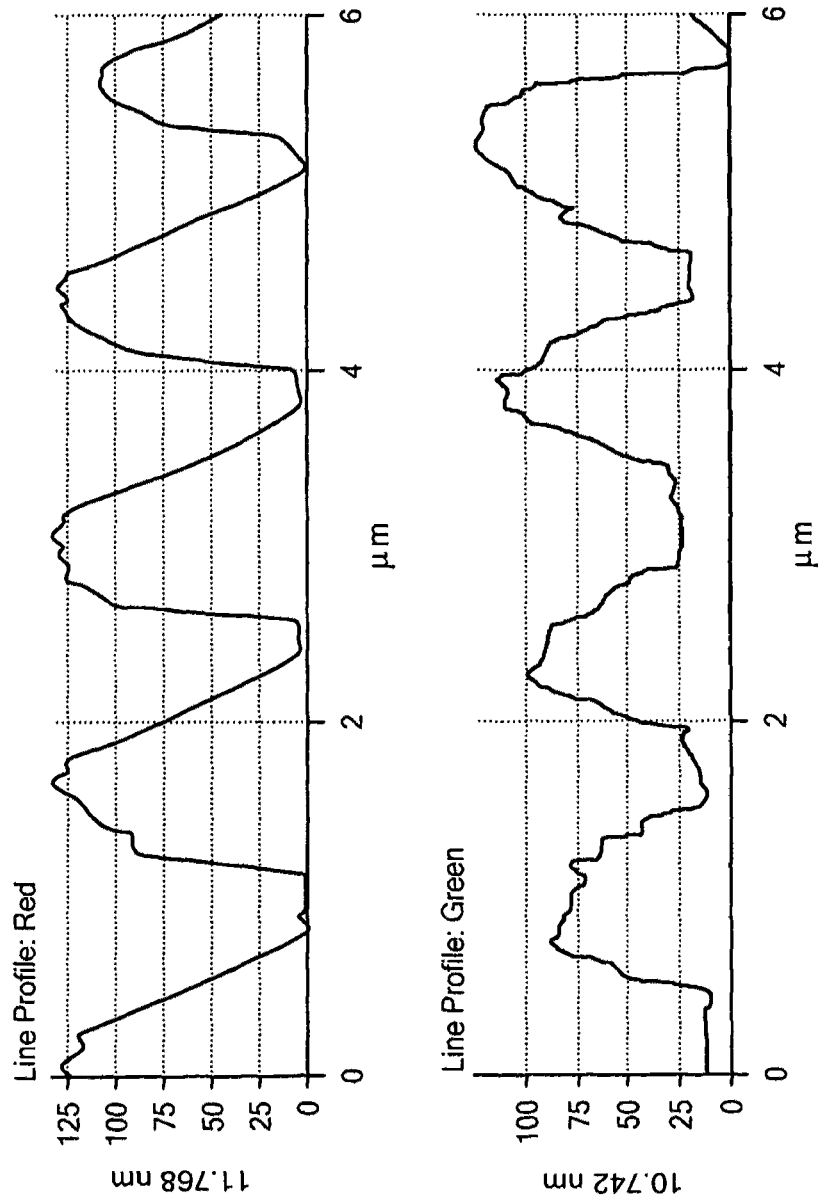

From high-resolution SEM micrographs of the fabricated Au nanorod shown in the inset of FIG. 2, it is evident that the nanoparticles assembled in the vias are fusing together to form a solid mass. While not intending to limit the invention to the exact mechanism, it is believed that the assembled particles fuse during assembly due to current flow through them. The deionized water used in the present experiments had a conductivity of 100 μS/cm due to the addition of $10^{-3}$ M ammonium hydroxide. During the assembly, the measured steady-state current was about 50 μA for an applied DC offset of 2 V to the AC voltage of 12 Vpp at a frequency of 50 kHz. Since the assembled nanoparticles are not fused when the AC voltage is applied without a DC offset (see inset of FIG. 5), the DC voltage is believed to be primarily responsible for fusion of the assemblies. The fusion is thought to arise from the diffusion of the atoms between the adjacent nanoparticles as a result of the increase in particle-junction temperature [20], [37], while the DC current is passing through the particle junctions. Results have shown that 5-nm particles could be assembled into vias that are about 100-nm high and 70-nm in diameter, as shown in FIG. 6. Thus, it is possible to fabricate much smaller size nanorods with higher aspect ratios (height/diameter) using the assembly approach of the present invention.

Electric-field-directed assembly, a fast and highly scalable process, has been used to assemble particles onto surfaces [28], [29]. In this technique, using an externally applied electric field, particles suspended in the solutions can be manipulated in very short time over large areas. The various forces on the particles can be precisely controlled to allow for a robust and reliable assembly. The characteristic of the applied electric field can be changed depending on particle properties. For example, charged particles can be transported to the desired surfaces using uniform electric field (DC), whereas, alternating electric field (AC) can be used to manipulate particles if they are uncharged. The assembly process is primarily governed by two different mechanisms, electrophoresis and dielectrophoresis. This is due to the fact that the applied electric field is a combination of a dynamically driven alternating electric field superimposed on a static electric field. The charged nanoparticles in the aqueous suspension are transported to the patterned template as a result of the uniform DC offset electric field. According to Debye-Hückel approximation to Derjaguin-Landau-Verwey-Overbeek theory [30], the induced surface charge q on the particles is calculated by the following equation:

$$q = 4\pi R \epsilon_r \epsilon_0 (1 + \kappa R) \zeta \quad (1)$$

where R is the radii of colloidal, $\epsilon_r$ is permittivity of suspension solution, $\epsilon_0$ is permittivity of air, $\kappa$ is inverse Debye length, and $\zeta$ is the zeta potential on the particles. Depending on the sign of the induced charge, the particles move toward the oppositely charged electrode due to the exerted electrophoretic force arising from the applied static electric field E. The terminal velocity of particles can be determined according to Stokes' law [31] shown in the following equation:

$$v = Eq/6\pi\mu R \quad (2)$$

where $\mu$ is the dynamic viscosity of the suspension. The dynamic electric field (ac) produces a time-dependent polarization of dipoles in particles. The resulting dielectrophoretic force [32] is $$F_{DEP} = 2\pi \epsilon_m Re[K(w)] a^3 \underline{\Delta} E^2 \quad (3)$$

where $\epsilon_m$ is the dielectric constant of medium, a is the particle radius, w is the angular field frequency, and $\underline{\Delta} E^2$ is the gradient of electric field. The direction of the force is determined by the sign of the real part of Clausius-Mossotti factor [30], Re[K(w)], as shown in the following equation:

$$Re[K(w)] = (\epsilon_p - \epsilon_m)/(\epsilon_p + 2\epsilon_m) + 3(\epsilon_m \sigma_p - \epsilon_p \sigma_m)/\tau_{MW}(\sigma_p + 2\sigma_m)^2 (1 + \omega^2 \tau_{MW}^2) \quad (4)$$

where $\epsilon_p$ is the dielectric constant of the medium, $\sigma_p$ and $\sigma_m$ are the conductivity of the particle and medium, respectively. $\tau_{MW}$ is the Maxwell-Wagner charge relaxation time that indicates decay of a dipolar distribution of charge on the surface of a spherical particle. For example, a case in which Re[K(w)]>0, particles will be attracted toward the regions where the electric field intensity is high (positive dielectrophoresis). To fabricate the nanorods in the via array, the gold nanoparticles suspended in the aqueous solution are exposed to an AC electric field with a DC offset. Since the gold nanoparticles are highly polarizable, Clausius-Mossotti factor is maximized in aqueous suspensions, Re[K(w)]≈1. Hence, positive dielectrophoresis is achieved attracting the nanoparticles into the PMMA vias, where the intensity of the electric field is high. However, a sufficient number of particles have to be close enough to the vias for particles to assemble into the vias. To increase the particle concentration near the vias, an electrophoretic force is applied on the negatively charged gold nanoparticles with a dc offset and the nanoparticles are transported to regions close to the vias. Since the PMMA is dielectric material, the nanoparticles only assemble into vias (not onto PMMA surface) under the applied DC voltage.

Applied DC and AC voltages used to drive assembly can be in the range from 0 to 100 kV, and the AC frequency can have a value from 0 to 500 MHz. Preferred range for AC voltage is 0 to 50V, for the DC voltage is 0-3V, and for AC frequency is 1 kHz to 1 MHz.

For a carbon nanotube with radius "r" and length "l" when exposed to an electric field, the dielectrophoretic force experienced by a nanotube is given by $$F_{DEP} = \frac{\pi}{6} r^2 l \epsilon_m Re\{K(\omega)\} \nabla E_{rms}^2 \quad (5)$$

where $K(\omega)$ is the Clausis-Mossotti factor, which is a function of the dielectric constants of the nanotube and the solution at the applied frequency. Both metallic and semiconducting SWNTs would experience positive dielectrophoresis at ~1 MHz. The density of the SWNTs assembled would also depend on the concentration of the solution, the time period of assembly, and the strength of the electric field.

EXAMPLES

Example 1

Materials and Methods

The following materials and methods were used in the Examples which follow. Gold nanoparticles (50 nm in diameter) supplied by Ted Pella Corporation were used in the assembly. The concentration of the particles in the aqueous suspension was $4.5 \times 10^{10}$ particles/cm$^3$. The zeta potential of the nanoparticles was measured using a Malvern Zeta Plus 90 zeta-potentiometer. To create nanoscale vias shown in FIG. 1(a), Cr/Au (2 nm Cr/120 nm Au) was sputtered on SiO$_2$/Si (470 nm layer of SiO$_2$ on 380 µm thick Si) wafer and then diced into 12 mm×12 mm chips. Positive photoresist (polymethyl-methacrylate (PMMA)) was spin-coated on the precleaned Cr/Au chips (precleaning with Piranha solution, H$_2$SO$_4$/H$_2$O$_2$, 2/1 vol/vol). The nanoscale via array was fabricated (in PMMA) using conventional electron-beam lithography. In total, 256 vias were patterned over a 40 µm×40 µm area. The via dimensions were in the range of 100-150 nm in depth, and 100-500 nm in diameter with separation 0.5-1 µm. The patterned PMMA substrate and a bare gold chip placed in the solution 5 mm away from the patterned substrate served as two electrodes (a positive and a negative electrode, respectively; positive side to the patterned substrate for negatively charged nanoparticles, negative side in the nanoparticle suspension) for the electric-field-directed assembly process shown in FIG. 1(b). An AC power supply unit was used to supply voltage between the two electrodes. The electrical connection between the electrodes and power supply was provided via copper clips attached on the top of the electrodes. After the voltage was applied for a certain time, the electrodes were pulled out from the solution while keeping the voltage on. As soon as the voltage is applied, nanoparticles are transported and assembled into the nanoscale vias. Following the assembly, nanoparticles fuse spontaneously within less than a minute in the vias forming nanorods (see FIG. 1(c)].

Example 2

Electric Field-Directed Assembly of Nanorods from Gold Nanoparticles

FIGS. 2(a) and 2(b) show top-down and high-angle-viewed scanning electron micrographs (SEMs) of an array of vias each 500-nm in diameter and 150-nm deep after electric-field directed assembly of 50-nm gold nanoparticles. An AC voltage of 12 Vpp (where pp denotes peak-to-peak) with a frequency of 10 kHz and a DC offset of 2 V was applied for 90 s during the assembly process. The SEM image of FIG. 2(b) also shows that the height of the produced nanorods is uniform over the array and exceeds the PMMA surface. An atomic force microscopy (AFM) scan of a 5 µm×5 µm area using a PSIA XE150 atomic force microscope is shown in FIG. 3. While the lateral dimensions of the nanorods were influenced by AFM tip effects, the vertical dimensions were in the range of 90-125 nm. By taking the 150-nm PMMA thickness into account, the results over 16 nanorods showed that the height varied between 240 nm (min) and 275 nm (max) with a standard deviation of 14.25. This excessive assembly of nanoparticles above the PMMA vias can be eliminated by reducing the time period of assembly.

Example 3

Effects of Electric Field Parameters on Nanoparticle Assembly

The effects of various parameters of the applied electric field on the nature of assembly were investigated. The behavior of nanoparticle assemblies in the vias under influence of individually applied DC and AC voltages was studied separately. FIG. 4 shows a topdown-viewed SEM after assembly was carried out by employing a uniform (DC) voltage of 2V for 90 s. Only a few particles were assembled in the vias. The induced charge on the 50-nm gold nanoparticles (measured zeta potential of −55 mV) is estimated to be $O(10^{-17})$ C. Using Stokes' law, the particles were estimated to reach a terminal velocity of ~30 μm/s at an applied voltage of 2 V. Although the velocity of the particles was sufficient to reach the template surface, most of the regions in the vias remained empty without having nanoparticle assembly.

Figure 5A:
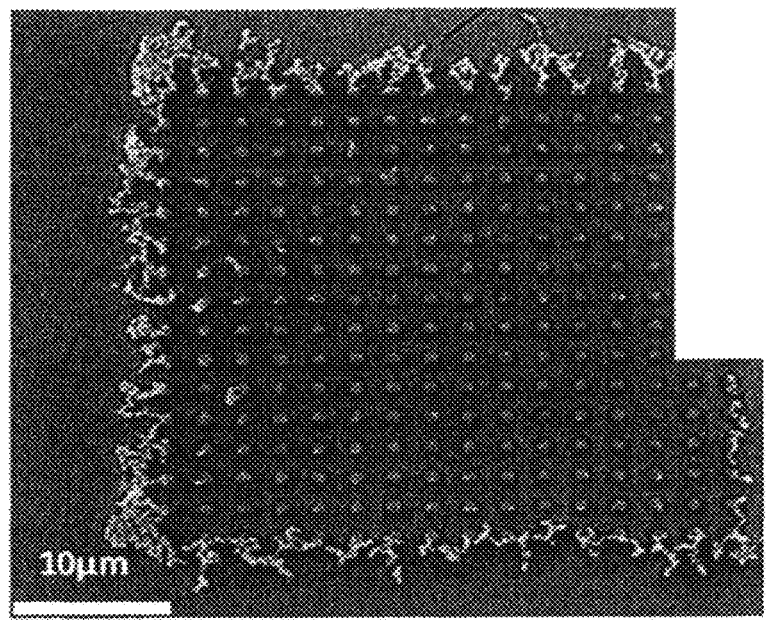
FIG. 5(a) shows an SEM image of a structure assembled by dielectrophoretic assembly after 12 Vpp was applied at a frequency of 10 kHz for 90 s. The inset image (FIG. 5(b)) is a high magnification SEM image showing particle chain formation in the exterior vias.
Figure 5B:
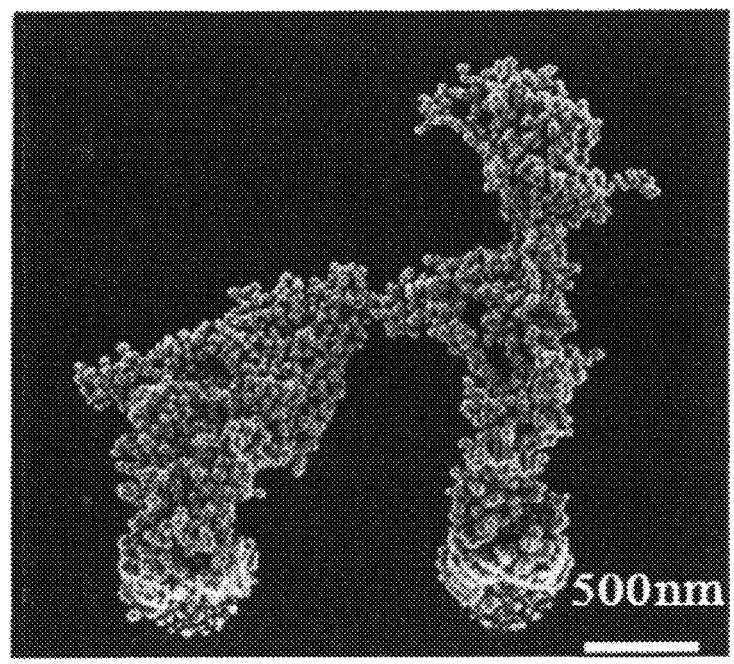
Figure 7A:
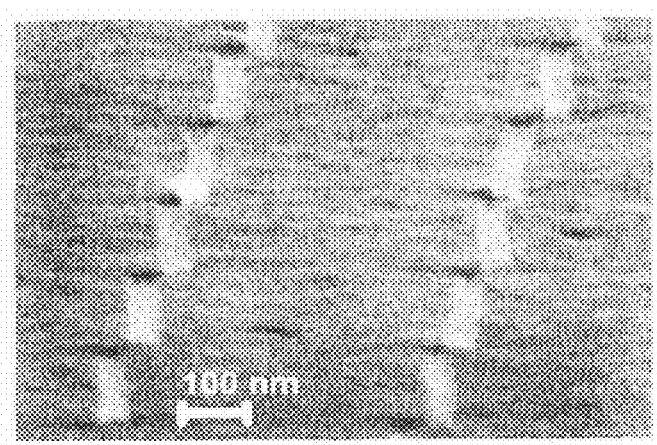
FIG. 7(a) shows a high angle SEM image of an array of nanoscale interconnects after removal of the PMMA resist layer.
Figure 7B:
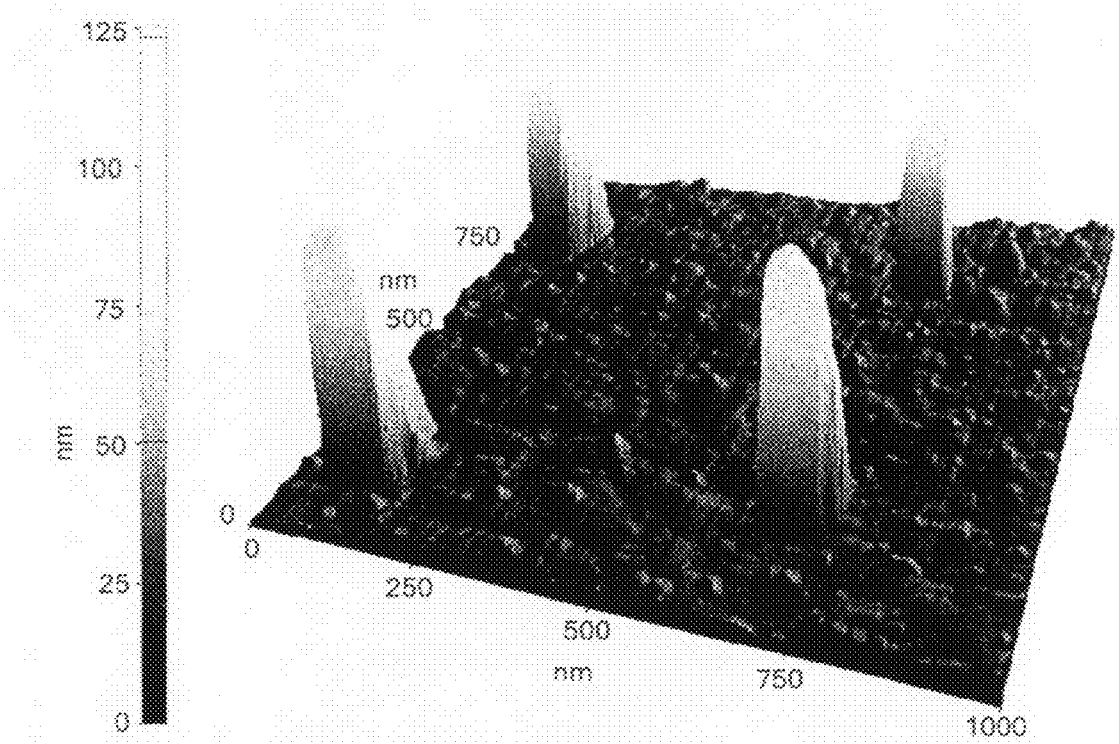
FIG. 7(b) shows an AFM image of the array.
Figure 8:
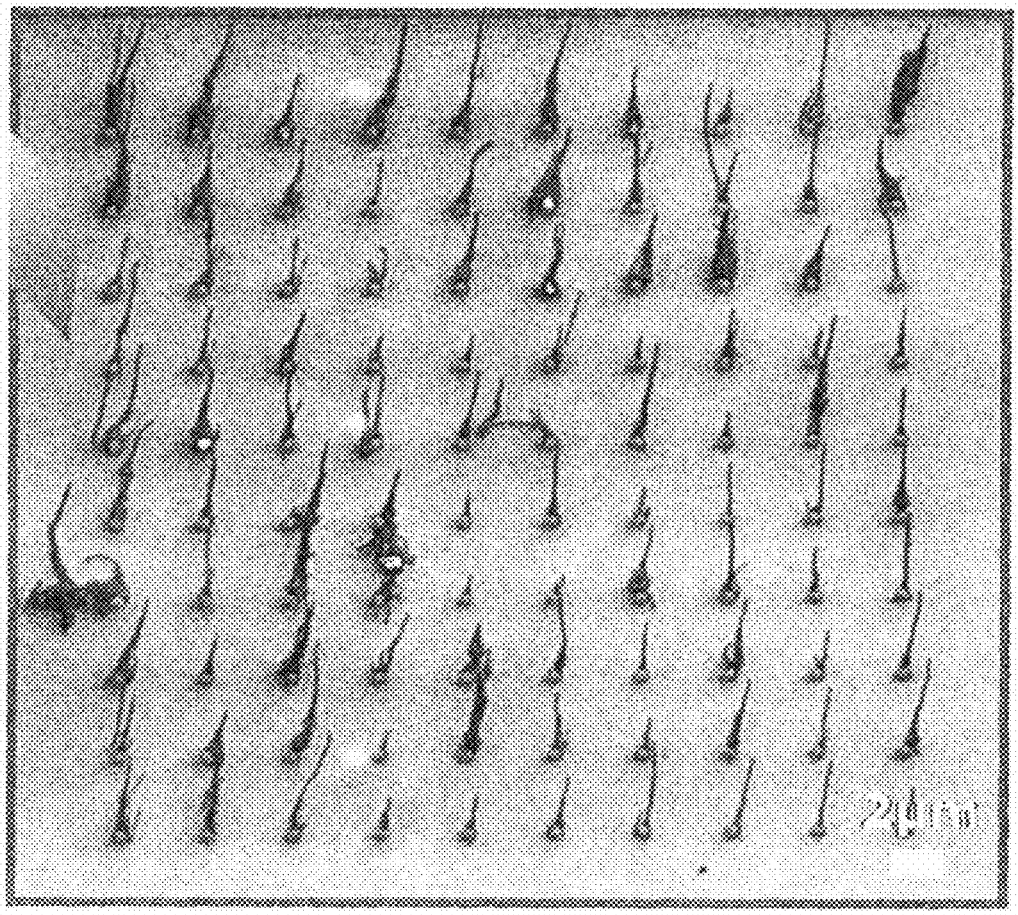
FIG. 8 shows an SEM image of single-walled carbon nanotubes assembled to form nanorods in vias of a nanosubstrate.

In order to test a dynamic electric field (AC) only, the voltage was set to 12 Vpp with a frequency of 10 kHz. The voltage was applied for 90 s. FIG. 5 shows that the nanoparticles only assembled into the vias located at the edges of the array (boundary vias), whereas a few particle assemblies were observed in the middle of the arrays (interior vias).

This result can be explained by the nonuniform electric-field gradient over the edges of the via array. It has been reported that since the dielectrophoretic force is proportional to gradient of electric field squared, nanoparticle assemblies grow at the sharp corners and the edges of electrodes [27]. For the pattern arrangement shown in FIG. 5, the exterior vias act as the edge of the via array and attract most of the particles in these regions.

The nanoparticle alignment to form chains in the exterior vias (see inset image in FIG. 5) was due to the induced dipole interactions between the particles [28]. As the Clausius-Mossotti factor takes its limiting value $Re[K(w)] \approx 1$, the chaining forces are maximized resulting in a nanoparticle chain network in the vias. The tip of the assembled nanoparticle on the gold surface of the conductive layer creates high-intensity local fields so that the other nanoparticles will be attracted to the tip, leading to particle agglomeration in the vias. It is worth noting that no fusion of the nanoparticles was observed although nanoparticle chains were formed under the applied AC voltage without DC offset.

Example 4

Electric Field-Directed Assembly of Nanorods from Carbon Nanotubes

Dielectrophoresis was employed to accomplish the directed perpendicular assembly of SWNTs. However, dielectrophoresis does not have the force to attract SWNTs close enough to the vias from the solution. Therefore, electrophoresis was also performed so that SWNTs are attracted to a template that contains patterned vias (cylindrical holes). For the investigation of the effects on assembly of SWNTs of using different kinds of electric fields, either AC voltage or DC voltage was applied between two substrates, a gold counter electrode was located parallel to hole-patterned surface immersed in a solution.

Figures 9A, 9B, 9C:
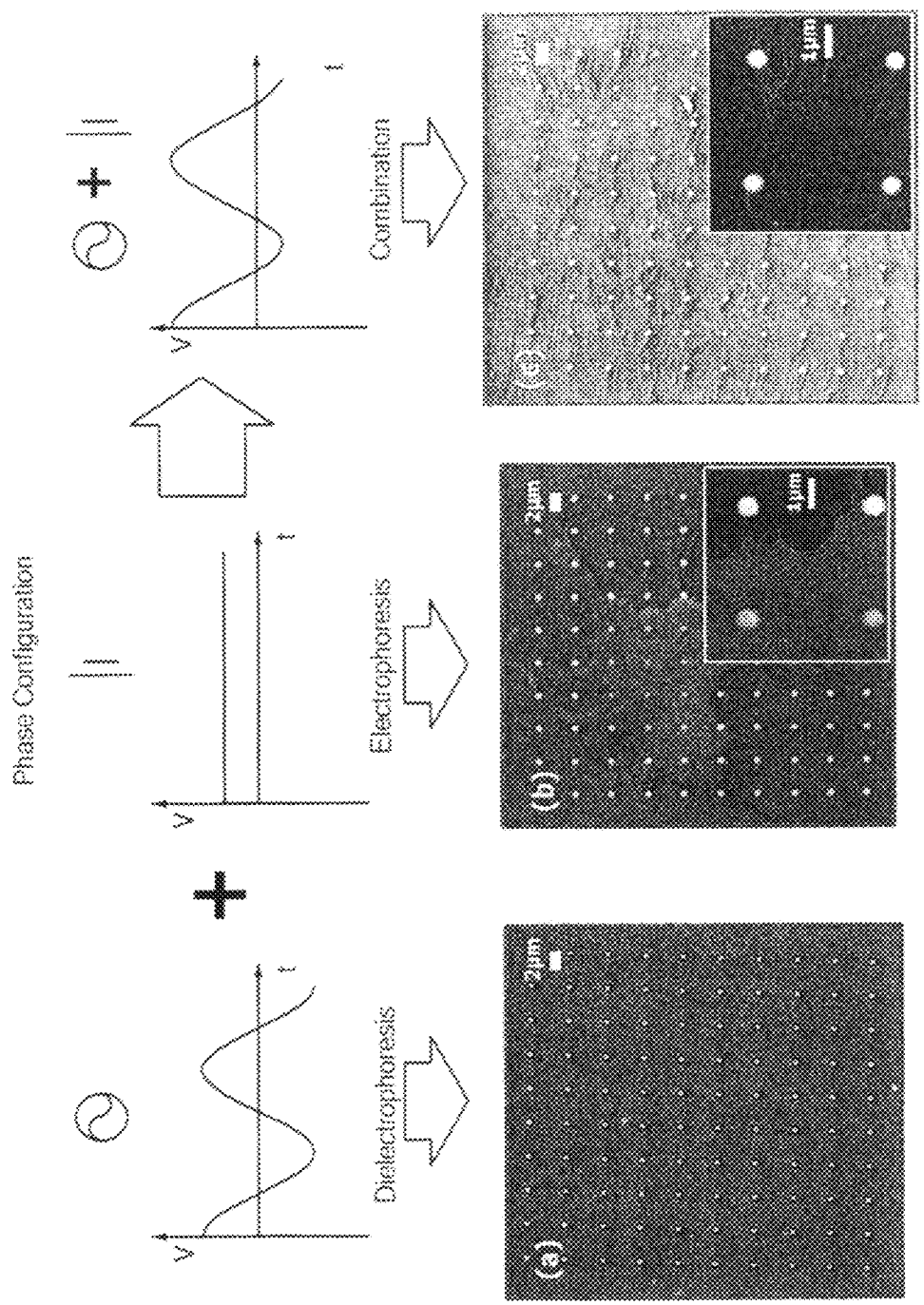
FIG. 9 shows the phase configuration on the substrate (above) and SEM images of the resulting assembly (below) for electrical fields consisting of AC only (FIG. 9(a)), DC only (FIG. 9(b)), and a combination of AC and DC (FIG. 9(c)).

A combination of dielectrophoresis and electrophoresis was implemented to get the SWNTs aligned along via holes as well as to transport SWNTs toward the vias. The phase configuration is illustrated in FIG. 9. The combined techniques were successful in getting nanotubes to assemble in via holes perpendicularly aligned to the gold surface, as shown in FIG. 9(c).

Dielectrophoresis were conducted at a frequency of 10 MHz for 90 seconds while the AC voltage between two parallel electrodes was varied between 5 $V_{PP}$ and 18 $V_{PP}$. The assembly was carried out using a suspension at pH 9 containing the dispersed SWNTs (4.8E-4 weight percent). The superimposed constant DC voltages were varied from 1V to 3V. After 90 seconds the substrate was drawn out of the solution at a rate of 80 mm/min with the potential still applied. The result is shown in FIG. 9C.

Figure 10:
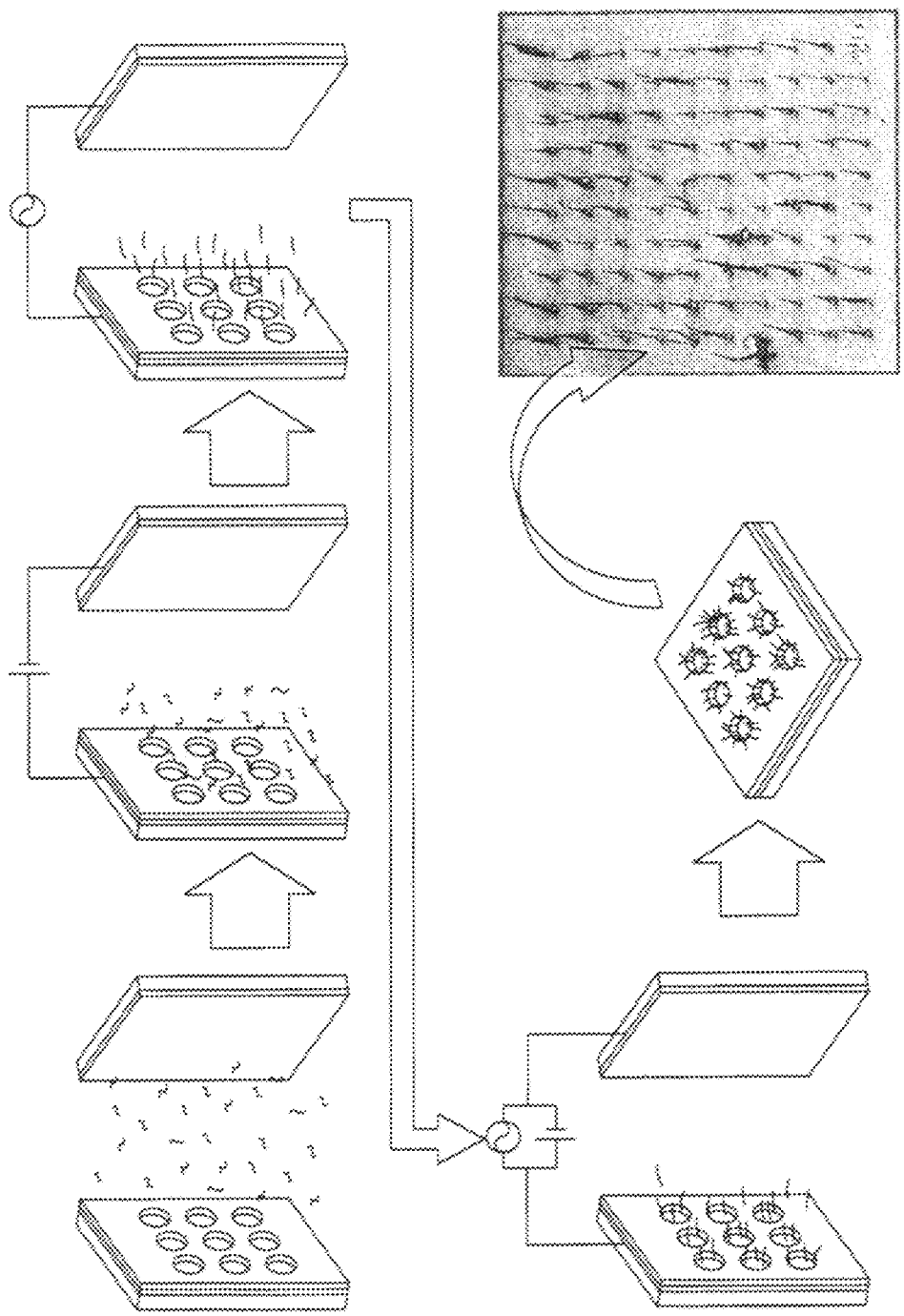
FIG. 10 presents a schematic diagram showing the sequence of an assembly process for SWNT. An SEM image of the final result is shown at bottom right.

Even though assembly of SWNTs was observed using dielectrophoresis combined with electrophoresis, many nanotubes were assembled without alignment. This may be due to the fact that the terminal velocity of charged nanotubes was high enough for them to reach the gold surface of the vias too fast, before they were aligned by the AC electric field. Therefore, in order to get better assembly, the assembly process was modified. In FIG. 10, a modified SWNT assembly process is displayed. After immersing two parallel electrodes into the SWNT solution, a DC electric field was applied first for a very short time (15 sec) to allow transport of SWNTs toward the substrate by electrophoresis. Following that, an AC electric field was applied for longer time (60 sec) to allow for the alignment of SWNTs along electric field using DEP. A combination of AC and DC electric fields was then applied for a short time (15 sec) to prevent nanotubes from being assembled into via holes by the DC electric field. Finally the substrate was taken out of the solution while the electric field was still applied. Vertical assembly of SWNTs in via holes was effectively achieved, as demonstrated by the SEM image shown in FIG. 3.

As used herein, "consisting essentially of" does not exclude materials or steps that do not materially affect the basic and novel characteristics of the claim. Any recitation herein of the term "comprising", particularly in a description of components of a composition or in a description of elements of a device, can be exchanged with "consisting essentially of" or "consisting of".

While the present invention has been described in conjunction with certain preferred embodiments, one of ordinary skill, after reading the foregoing specification, will be able to effect various changes, substitutions of equivalents, and other alterations to the compositions and methods set forth herein. It is therefore intended that the protection granted by Letters Patent hereon be limited only by the definitions contained in the appended claims and equivalents thereof.

REFERENCES

[1] R. H. Baughman, A. A. Zakhidov, and W. A. de Heer, "Carbon nanotubes—The route, toward applications," *Science*, vol. 297, pp. 787-792, 2002.

[2] M.-C. Daniel and D. Astruc, "Gold nanoparticles: Assembly, supramolecular chemistry, quantum-size-related properties, and applications toward biology, catalysis, and nanotechnology," *Chem. Rev.*, vol. 104, pp. 293-346, 2004.

[3] X. Huang, S. Neretina, and M. A. El-Sayed, "Gold nanorods: From synthesis and properties to biological and biomedical applications," *Adv. Mater.*, vol. 21, pp. 4880-4910, 2009.

[4] C. B. Murray, C. R. Kagan, and M. G. Bawendi, "Synthesis and characterisation of monodisperse nanocrystals and close-packed nanocrystal assemblies," *Annu. Rev. Mater. Sci.*, vol. 30, pp. 545-610, 2000.

[5] J. Liu and Y. Lu, "A colorimetric lead biosensor using DNAzyme-directed assembly of gold nanoparticles," *J. Amer. Chem. Soc.*, vol. 125, pp. 6642-6643, 2003.

[6] B. Yan, A. Thubagere, W. R. Premasiri, L. D. Ziegler, L. D. Negro, and B. M. Reinhard, "Engineered SERS substrates with multiscale signal enhancement: Nanoparticle cluster arrays," *Amer. Chem. Soc (ACS) Nano*, vol. 3, pp. 1190-1202, 2009.

[7] S. Colodrero, M. Ocana, and H. Miguez, "Nanoparticle-based onedimensional photonic crystals," *Langmuir*, vol. 24, pp. 4430-4434, 2008.

[8] K. H. Bhatt and O. D. Velev, "Control and modeling of the dielectrophoretic assembly of on-chip nanoparticle wires," *Langmuir*, vol. 20, pp. 467-476, 2004.

[9] K. D. Hermanson, S. O. Lumsdon, J. P. Williams, E. W. Kaler, and O. D. Velev, "Dielectrophoretic assembly of electrically functional microwires from nanoparticle suspensions," *Science*, vol. 294, pp. 1082-1085, 2001.

[10] S. A. Maier, P. G. Kik, H. A. Atwater, S. Meltzer, E. Harel, B. E. Koel, and A. A. G. Requicha, "Local detection of electromagnetic energy transport below the diffraction limit in metal nanoparticle plasmon waveguides," *Nat. Mater.*, vol. 2, pp. 229-232, 2003.

[11] W. Lu and C. M. Lieber, "Nanoelectronics from the bottom up," *Nat. Mater.*, vol. 6, pp. 841-850, 2007.

[12] Y. Cui, M. T. Bjork, J. A. Liddle, C. Sonnichsen, B. Boussert, and A. P. Alivisatos, "Integration of colloidal nanocrystals into lithographically patterned devices," *Nano Lett.*, vol. 4, pp. 1093-1098, 2004.

[13] N.-G. Cha, Y. Echegoyen, T.-H. Kim, J.-G. Park, and A. A. Busnaina, "Convective assembly and dry transfer of nanoparticles using hydrophobic/hydrophilic monolayer templates," *Langmuir*, vol. 25, pp. 11375-11382, 2009.

[14] P. Maury, M. Escalante, D. N. Reinhoudt, and J. Huskens, "Directed assembly of nanoparticles onto polymer-imprinted or chemically patterned templates fabricated by nanoimprint lithography," *Adv. Mater.*, vol. 17, pp. 2718-2723, 2005.

[15] X. Xiong, P. Makaram, A. Busnaina, K. Bakhtari, S. Somu, N. McGruer, and J. Park, "Large scale directed assembly of nanoparticles using nanotrench templates," *Appl. Phys. Lett.*, vol. 89, pp. 193108-1-193108-3, 2006.

[16] H. A. Pohl, *Dielectrophoresis*. Cambridge, Mass.: Cambridge Univ. Press, 1978.

[17] R. Kretschmer and W. Fritzsche, "Pearl chain formation of nanoparticles in microelectrode gaps by dielectrophoresis,"*Langmuir*, vol. 20, pp. 11797-11801, 2004.

[18] N. Khanduja, S. Selvarasah, C. L. Chen, and M. R. Dokmeci, X. Xiong, P. Makaram, and A. Busnaina, "Three dimensional controlled assembly of gold nanoparticles using a micromachined platform," *Appl. Phys. Lett.*, vol. 90, pp. 083105-1-083105-3, 2007.

[19] *International Technology Roadmap For Semiconductors 2007 Edition Interconnect*. ITRS, 2007. Available: http://www.itrs.net/Links/2007ITRS/Home2007.htm

[20] H. J. Lee, T. Yasukawab, M. Suzukia, S. H. Leec, T. Yaoc, Y. Takid, A. Tanakad, M. Kameyamad, H. Shikua, and T. Matsue, "Simple and rapid preparation of vertically aligned gold nanoparticle arrays and fused nanorods in pores of alumina membrane based on positive dielectrophoresis," *Sens. Actuators B*, vol. 136, pp. 320-325, 2009.

[21] Naeemi A, Meindl J D. 2007. "Design and performance modeling for single-walled carbon nanotubes as local, semiglobal, and global interconnects in gigascale integrated systems". *Electron. Devices IEEE Trans.* 54:26-37

[22] Nihei M, Kondo D, Kawabata A, Sato S, Shioya H, et al. 2005. Low-resistance multi-walled carbon nanotube vias with parallel channel conduction of inner shells. Proc. IEEE Int. Interconnect Tech. Conf., pp. 234-36. Piscataway: IEEE

[23]. Vajtai R, Bingqing W, Yung Joon J, Anyuan C, Biswas S K, et al. 2003. Building and testing organized architectures of carbon nanotubes. Nanotechnol. IEEE Trans. 2:355-61

[24]. Nieuwoudt A, Massoud Y. 2006. Understanding the impact of inductance in carbon nanotube bundles for VLSI interconnect using scalable modeling techniques. Nanotechnol. IEEE Trans. 5:758-65

[25] Cao A, Baskaran R, Frederick M J, Turner K, Ajayan P M, Ramanath G. 2003. "Direction-selective and length-tunable in-plane growth of carbon nanotubes". Adv. Mater. 15:1105-9

[26]. Ural A, Li Y, Dai H. 2002. "Electric-field-aligned growth of single-walled carbon nanotubes on surfaces". Appl. Phys. Lett. 81:3464-66

[27] B. Ozturk, C. Blackledge, B. N. Flanders, and D. R. Grischkowsky, "Reproducible interconnects assembled from gold nanorods," *Appl. Phys. Lett.*, vol. 88, pp. 073108-1-073108-3, 2006.

[28] W. M. Choi and O. O. Park, "The fabrication of micropatterns of a 2D colloidal assembly by electrophoretic deposition," *Nanotechnology, vol.* 17, pp. 325-329, 2006.

[29] K. H. Bhatt, S. Grego, and O. D. Velev, "An AC electrokinetic technique for collection and concentration of particles and cells on patterned electrodes," *Langmuir, vol.* 21, pp. 6603-6612, 2005.

[30] D. F. Evans and H. Wennerstrom, *The Colloidal Domain Where Physics, Chemistry, Biology, and Technology Meet*, 2nd ed. New York: Wiley-VCH, 1999, ch. 8, pp. 351-353.

[31] P. C. Hiemenz, *Principles of Colloid and Surface Chemistry*. J. J. Lagowski, Ed., New York, N.Y.: Marcel Dekker, Inc., 1986, pp. 65-66.

[32] T. B. Jones, Electromechanics of Particles. Cambridge, Mass.: Cambridge Univ. Press, 1995, pp. 33-36.

[33] X. Xiong, A. Busnaina, S. Selvarasah, S. Somu, M. Wei, J. Mead, C. L. Chen, J. Aceros, P. Makaram, and M. R. Dokmeci, "Directed assembly of gold nanoparticle nanowires and networks for nanodevices," *Appl. Phys. Lett.*, vol. 91, pp. 063101-1-063101-3, 2007.

[34] O. D. Velev and K. H. Bhatt, "On-chip micromanipulation and assembly of colloidal particles by electric fields," *Soft Matter.*, vol. 2, pp. 738-750, 2006.

[35] H. Morgan and N. G. Green, AC Electrokinetics: Colloids and Nanoparticles. Baldock, U.K.: Research Studies Press, 2002.

[36] R. J. Hunter, *Foundations of Colloid Science*. Oxford, U.K.: Oxford Univ. Press, 2001.

[37] L. Bernard, M. Calame, S. J. van der Molen, J. Liao, and C. Schonenberger, "Controlled formation of metallic nanowires via Au nanoparticle ac trapping," *Nanotechnology*, vol. 18, pp. 235202-1-235202-6, 2007.

[38] A. V. Kabashin, P. Evans, S. Pastkovsky, W. Hendren, G. A. Wurtz, R. Atkinson, R. Pollard, V. A. Podolskiy, and A. V. Zayats, "Plasmonic nanorod metamaterials for biosensing," *Nat. Mater.*, vol. 8, pp. 867-871, 2009.

That which is claimed is:

1. A method of fabricating a nanoscale interconnect by electrical field directed assembly of nanoelements, the method comprising the steps of:

(a) providing a nanosubstrate comprising a base layer, a conductive layer deposited onto the base layer, and an insulating layer deposited onto the conductive layer, the insulating layer comprising a via, the via forming a void in the insulating layer and defining a pathway through the insulating layer that exposes the conductive layer;

(b) contacting the nanosubstrate with an aqueous suspension of nanoelements; and (c) applying an essentially uniform electrical field between the conducting layer and an electrode in the suspension, the electrical field consisting of the sum of a DC voltage and an AC voltage; wherein the nanosubstrate and the suspension electrode are substantially planar, and wherein the shape and size of the nanosubstrate and the suspension electrode are substantially the same, whereby nanoelements from the suspension migrate into the via to form a nanoscale interconnect having an electrical connection with the conductive layer.

2. The method of claim 1, wherein the nanosubstrate comprises a plurality of vias, and a plurality of nanoscale interconnects are formed.

3. The method of claim 1, wherein the aqueous suspension comprises 0.1-1 mM ammonium hydroxide.

4. The method of claim 1, wherein the nanoelements are metallic nanoparticles or metallic carbon nanotubes and a metallic interconnect is formed.

5. The method of claim 1, wherein the nanoparticles comprise a metal selected from gold, copper, silver, tungsten, and aluminum, or the nanotubes are single-walled metallic single-walled carbon nanotubes, semiconducting single-walled carbon nanotubes, or multi-walled carbon nanotubes.

6. The method of claim 1, wherein the DC voltage is about 2 volts and the steady-state current is about 50 µA.

7. The method of claim 1, wherein the AC voltage is about 12 volts peak to peak.

8. The method of claim 1, wherein the AC frequency is about 10 kilohertz.

9. The method of claim 1, wherein the interconnect formed has a diameter less than 30 nm and an aspect ratio of 3 or more.

10. The method of claim 1, wherein the nanoelements are nanoparticles, and the nanoparticles fuse to form a solid mass in the interconnect.

11. The method of claim 1, wherein the electrode in the suspension is a distance of about 5 mm removed from the nanosubstrate.

12. The method of claim 1, wherein step (c) is carried out at about 15-30° C.

13. The method of claim 1, further comprising depositing one or more additional insulating layers, conductive layers, or photoresist layers and/or performing lithography so as to establish one or more circuit elements in electrical connection with one or more of the formed nanoscale interconnects.

14. The method of claim 1 wherein the nanoelements are metallic nanoparticles, and the method comprises reducing the metal grain boundaries in the formed interconnect.

15. The method of claim 1, wherein the pH of the suspension is greater than 7.

16. A nanoscale interconnect fabricated by the method of claim 1, wherein the interconnect comprises fused metallic nanoparticles.

17. The nanoscale interconnect of claim 16 having an aspect ratio of at least about 3.

18. The nanoscale interconnect of claim 17 having a diameter of less than 30 nm.

19. The nanoscale interconnect of claim 16 which is metallic.

20. The nanoscale interconnect of claim 19 comprising a metal selected from gold, copper, silver, tungsten, and aluminum.

21. The nanoscale interconnect of claim 16 which is semiconducting.

22. The nanoscale interconnect of claim 21 comprising single-walled carbon nanotubes.

23. An integrated circuit or sensor comprising the nanoscale interconnect of claim 16.

24. The method of claim 1, wherein the AC frequency is from 1 kilohertz to 100 kilohertz.

25. The method of claim 1, wherein the AC voltage is greater than 12 volts peak-to-peak.

26. The method of claim 1, wherein the migration of nanoelements into the via is essentially complete in about 60 seconds or less.

* * * * *